(12) United States Patent
Pan et al.

(10) Patent No.: US 8,878,337 B1
(45) Date of Patent: Nov. 4, 2014

(54) INTEGRATED CIRCUIT STRUCTURE HAVING A CAPACITOR STRUCTURED TO REDUCE DISHING OF METAL LAYERS

(75) Inventors: Hong-Tsz Pan, Cupertino, CA (US); Yun Wu, San Jose, CA (US); Shuxian Wu, San Jose, CA (US); Qi Lin, Cupertino, CA (US); Bang-Thu Nguyen, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 284 days.

(21) Appl. No.: 13/186,279

(22) Filed: Jul. 19, 2011

(51) Int. Cl.
*H01L 21/02* (2006.01)

(52) U.S. Cl.
USPC ............... 257/532; 257/E31.001; 361/271; 438/107

(58) Field of Classification Search
USPC ............ 257/532, E31.001; 361/271
See application file for complete search history.

(56) References Cited

U.S. PATENT DOCUMENTS

| | | | | |
|---|---|---|---|---|
| 4,247,826 A * | 1/1981 | Gappa et al. | | 330/264 |
| 5,087,951 A * | 2/1992 | Chance et al. | | 257/296 |
| 5,510,637 A * | 4/1996 | Hsu et al. | | 257/304 |
| 5,650,346 A * | 7/1997 | Pan et al. | | 438/201 |
| 5,753,954 A * | 5/1998 | Chi et al. | | 257/318 |
| 5,773,871 A * | 6/1998 | Boyd et al. | | 257/532 |
| 5,858,831 A * | 1/1999 | Sung | | 438/241 |
| 6,232,634 B1 * | 5/2001 | Wu et al. | | 257/316 |
| 6,300,653 B1 * | 10/2001 | Pan | | 257/296 |
| 6,545,305 B1 * | 4/2003 | Randazzo | | 257/296 |
| 7,064,018 B2 * | 6/2006 | Madurawe | | 438/149 |
| 7,288,807 B1 * | 10/2007 | Akamatsu | | 257/296 |
| 7,315,054 B1 * | 1/2008 | Moench et al. | | 257/304 |
| 7,781,280 B2 * | 8/2010 | Omura | | 438/215 |
| 7,800,199 B2 * | 9/2010 | Oh et al. | | 257/532 |
| 7,838,358 B2 * | 11/2010 | Omura | | 438/215 |
| 7,851,861 B2 * | 12/2010 | Tu | | 257/350 |
| 8,071,438 B2 * | 12/2011 | Lee | | 438/239 |
| 8,138,037 B2 * | 3/2012 | Chudzik et al. | | 438/199 |
| 8,164,120 B2 * | 4/2012 | Omura | | 257/209 |
| 8,237,227 B2 * | 8/2012 | Lai et al. | | 257/368 |
| 8,253,178 B1 * | 8/2012 | Yang et al. | | 257/291 |
| 8,294,216 B2 * | 10/2012 | Chuang et al. | | 257/368 |
| 8,368,136 B2 * | 2/2013 | Chuang et al. | | 257/306 |
| 2001/0011760 A1 * | 8/2001 | Kim | | 257/537 |
| 2001/0022377 A1 * | 9/2001 | Chan et al. | | 257/321 |
| 2003/0036228 A1 * | 2/2003 | Jao | | 438/200 |
| 2004/0027784 A1 * | 2/2004 | Kamath et al. | | 361/306.3 |
| 2004/0152243 A1 * | 8/2004 | Kuroda et al. | | 438/129 |
| 2005/0110070 A1 * | 5/2005 | Omura | | 257/311 |
| 2007/0207579 A1 * | 9/2007 | Omura | | 438/253 |
| 2007/0221957 A1 * | 9/2007 | Kitajima et al. | | 257/202 |
| 2007/0252217 A1 * | 11/2007 | Oki | | 257/369 |
| 2008/0122032 A1 * | 5/2008 | Tu et al. | | 257/532 |
| 2008/0149979 A1 * | 6/2008 | Kim | | 257/304 |
| 2008/0173978 A1 * | 7/2008 | Tu | | 257/532 |

(Continued)

*Primary Examiner* — Caleb Henry
(74) *Attorney, Agent, or Firm* — Raymond R. Moser, Jr.; LeRoy D. Maunu; Lois D. Cartier

(57) ABSTRACT

A method and integrated circuit structure for mitigating metal gate dishing resulting from chemical mechanical polishing. The integrated circuit structure comprises a first area comprising at least one first type device; a second area comprising at least one second type device; a third area comprising at least one capacitor having an uppermost layer of polysilicon, where the capacitor area is greater than a sum of the first and second areas. The method utilizes the polysilicon of the capacitor to mitigate metal gate dishing of a metal gate of at least one device.

15 Claims, 4 Drawing Sheets

(56) References Cited

U.S. PATENT DOCUMENTS

| | | | |
|---|---|---|---|
| 2008/0191312 A1* | 8/2008 | Oh et al. | 257/532 |
| 2009/0095995 A1* | 4/2009 | Kawashima et al. | 257/296 |
| 2009/0108403 A1* | 4/2009 | Gogoi | 257/532 |
| 2009/0224323 A1* | 9/2009 | Im et al. | 257/355 |
| 2009/0224364 A1* | 9/2009 | Oh et al. | 257/532 |
| 2009/0236648 A1* | 9/2009 | Maeda et al. | 257/296 |
| 2009/0242953 A1* | 10/2009 | Booth et al. | 257/301 |
| 2009/0285419 A1* | 11/2009 | Shih et al. | 381/174 |
| 2010/0001332 A1* | 1/2010 | Chuang et al. | 257/310 |
| 2010/0001369 A1* | 1/2010 | Chuang et al. | 257/526 |
| 2010/0038692 A1* | 2/2010 | Chuang et al. | 257/298 |
| 2010/0127349 A1* | 5/2010 | Quinn | 257/532 |
| 2010/0187586 A1* | 7/2010 | Pellela et al. | 257/300 |
| 2010/0283926 A1* | 11/2010 | Huang et al. | 349/38 |
| 2011/0053332 A1* | 3/2011 | Lee | 438/381 |
| 2011/0062505 A1* | 3/2011 | Omura | 257/296 |
| 2011/0254097 A1* | 10/2011 | Noguchi et al. | 257/368 |
| 2011/0266637 A1* | 11/2011 | Lee et al. | 257/410 |
| 2012/0070944 A1* | 3/2012 | Kim et al. | 438/128 |
| 2012/0074475 A1* | 3/2012 | Chew et al. | 257/295 |
| 2012/0091519 A1* | 4/2012 | Tu | 257/303 |
| 2012/0313178 A1* | 12/2012 | Liao et al. | 257/368 |
| 2013/0020651 A1* | 1/2013 | Zhu et al. | 257/369 |
| 2014/0113443 A1* | 4/2014 | WON et al. | 438/591 |
| 2014/0131808 A1* | 5/2014 | Ando et al. | 257/369 |
| 2014/0131809 A1* | 5/2014 | Ando et al. | 257/369 |

* cited by examiner

INTEGRATED CIRCUIT STRUCTURE
HAVING A CAPACITOR STRUCTURED TO
REDUCE DISHING OF METAL LAYERS

FIELD OF THE INVENTION

Embodiments of the present invention generally relate to a integrated circuit manufacturing techniques and, more particularly, to a method and integrated circuit structure for mitigating metal gate dishing during the manufacturing process.

BACKGROUND

Integrated circuits comprising devices with node widths of less than 32 nm typically utilize a combination of high dielectric constant (high k) material and metal to form gate structures for metal oxide semiconductor (MOS) devices. There are two primary approaches to fabricating high k-metal gate structures (referred to as a high k stack) on a semiconductor substrate: a gate first approach and a gate last approach. A gate first approach uses a single deposition step for depositing one type of work function metal to form the high k stack for a single type of device, either PMOS or NMOS. Using a gate last approach, both PMOS and NMOS devices can be created on the same substrate. As such, metals having two different work functions are deposited to respectively form the PMOS and NMOS gate structures in a single integrated circuit.

To utilize a gate last approach, after high k dielectric deposition, polysilicon is deposited across the substrate, then masked and etched to form a polysilicon cap to protect the dielectric while other process steps are completed. Subsequently, the polysilicon is removed (etched) from the high k stack of a first type device (e.g., PMOS device), while the high k stack of a second type device (e.g., NMOS device) is masked. A metal having a particular work function (e.g., titanium nitride (TiN)) for producing a P-type device is deposited on top of the high k dielectric of the PMOS device. The gate structure is completed by filling a contact via with aluminum to form a conductive path to the metal. The substrate is then polished using a chemical mechanical polishing (CMP) system to planarize the aluminum at the top of the high k stack and remove the mask.

Removal of the mask from the high k stack of the NMOS device exposes the polysilicon atop the high k dielectric of the NMOS device. The polysilicon is removed (e.g., etched) to expose the high k dielectric. A metal having a particular work function (e.g., titanium aluminum nitride (TiAlN)) for producing an N-type device is deposited on top of the high k dielectric of the NMOS device. Filling a contact via with aluminum to form a conductive path to the metal completes the gate structure. The substrate is then polished using a chemical mechanical polishing (CMP) system to planarize the metal at the top of the high k stack.

Simultaneously with creating the PMOS device, MOS capacitors are also fabricated. The MOS capacitors are formed in the same manner as a PMOS device, except the drain and source are connected to one another to form a first electrode (bottom electrode) of the capacitor and the gate metal forms a second electrode (top electrode) of the capacitor. These capacitors have very large surface area metallization compared to the width of the gate metallization.

When this procedure is followed, the contact metal (e.g., aluminum) of the PMOS high k stack and the MOS capacitors is polished twice and may incur substantial dishing. The dishing may be so severe that the gate metal is exposed and the threshold voltage of the PMOS device is significantly altered. The result may be an inoperative PMOS device.

Additionally, the size of the metalized surface area of the capacitors also results in dishing. Such dishing occurs whether the capacitor is polished once or twice. Thus, a dishing problem may be experienced in a gate first approach or if the capacitors were formed simultaneously with the NMOS devices in a gate last approach.

Therefore, there is a need in the art for a method and integrated circuit structure for mitigating metal gate dishing.

SUMMARY

A method and integrated circuit structure for mitigating metal gate dishing resulting from chemical mechanical polishing are described. The integrated circuit structure comprises a first area comprising at least one first type device; a second area comprising at least one second type device; and a third area comprising at least one capacitor having an uppermost layer of polysilicon, wherein the capacitor area is greater than a sum of the first and second areas. The third area is distributed among the first and second areas. The method utilizes the polysilicon of the capacitor to mitigate metal gate dishing of a metal gate of at least one device.

According to another embodiment, an integrated circuit structure includes at least one first type device comprising a first metal electrode; at least one second type device comprising a second metal electrode; and at least one capacitor comprising a polysilicon layer to enable uniform polishing of the first and second metal electrodes. The at least one capacitor is distributed among the first and second type devices.

According to yet another embodiment, a method of forming an integrated circuit includes forming a first high k gate stack for at least one first type device, wherein the first high k gate stack has a first surface area; forming a second high k gate stack for at least one second type device, wherein the second high k gate stack has a second surface area; and forming a polysilicon cap upon at least one capacitor, wherein the polysilicon cap has a third surface area. The third surface area is larger than a combined surface area of the first surface area and second surface area. The third surface area is distributed among the first and second surface areas.

BRIEF DESCRIPTION OF THE DRAWINGS

So that the present invention can be understood in detail, a more particular description may be had by reference to specific embodiments, some of which are illustrated in the appended drawings. It is to be noted, however, that the appended drawings illustrate only exemplary embodiments, and are therefore not to be considered limiting of the scope of the invention, which may admit to other embodiments.

FIG. 2 is a flow diagram of a method for processing a substrate in accordance with at least one embodiment; and FIG. 3 depicts a top plan view of a substrate having components arranged in accordance with at least one embodiment.

DETAILED DESCRIPTION

Methods and structures for mitigating metal gate dishing are described. More specifically, a first area of a substrate including at least one first type device (e.g., PMOS device), a second area of the substrate includes at least one second type device (e.g., NMOS device), and a third area of the substrate includes at least one capacitor having an uppermost layer of polysilicon, where the third area is equal to or greater than the combined area of the first and second areas. By having large areas of polysilicon (i.e., the capacitors), the dishing effect from polishing the PMOS and NMOS devices is mitigated.

Figure 1:
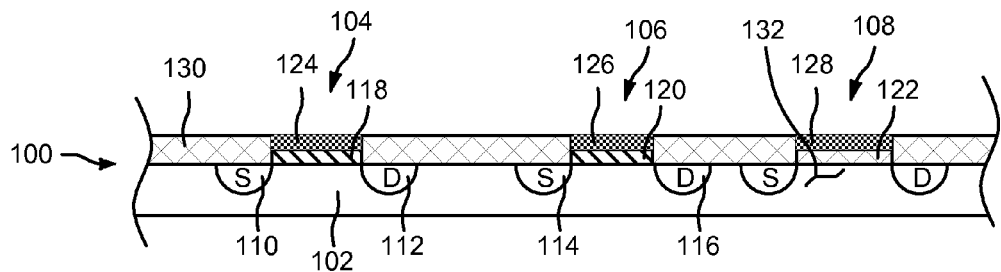
FIGS. 1-1 through 1-7 depict a cross-sectional view of a substrate being processed by a sequence of processing steps in accordance with one embodiment.
Figures 1, 2:
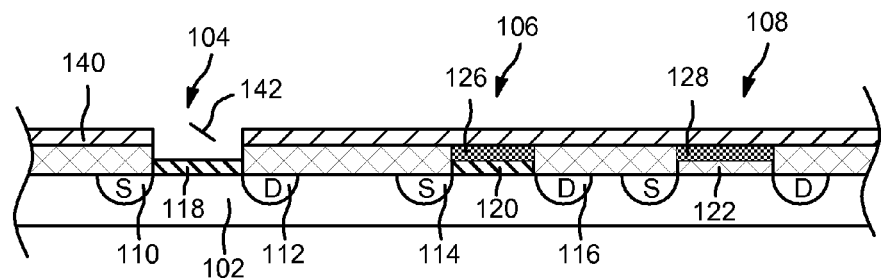

FIGS. 1-1 through 1-7 depict a cross-sectional view of a substrate 100 as the substrate is processed to form at least one NMOS device and at least one PMOS device, as well as to create at least one capacitor having a polysilicon uppermost layer. The polysilicon uppermost layer forms an electrode (top electrode) of the capacitor. FIG. 2 depicts a flow diagram of the steps used to perform the process illustrated in FIGS. 1-1 through 1-7. The following description refers to FIGS. 1-1 through 1-7 and FIG. 2 simultaneously. In the embodiment described with respect to FIGS. 1-1 through 1-7 and FIG. 2, the first type device is a PMOS device and the second type device is an NMOS device. Those skilled in the art will understand that in an alternative embodiment, the first type device is an NMOS device and the second type device is a PMOS device.

At step 202 in FIG. 2, a method 200 according to one embodiment starts, and proceeds to step 204. It is assumed that, at this point, the drain and source have been defined for the devices (transistors and MOS capacitors) in the bulk substrate and the high k gate dielectric is deposited at the gate and capacitor locations. At step 204, at the gate locations and the capacitor location, polysilicon is formed over the high k dielectric. For example, using conventional processes, the polysilicon is deposited using a low pressure chemical vapor deposition (LPCVD), then masked, and etched to create a polysilicon cap on the high k gate dielectric and the capacitor dielectric.

FIG. 1-1 depicts a cross-sectional view of a substrate 100 that has been processed to the point where the bulk semiconductor layer 102 supports at least one partially fabricated PMOS device 104, at least one partially fabricated NMOS device 106 and at least one MOS capacitor 108. FIG. 1-1 depicts the substrate after completion of step 204 of FIG. 2. In one embodiment, the devices are being fabricated using a gate last process.

The PMOS device 104 comprises a source region 110, a drain region 112, a high k dielectric 118, and a polysilicon cap 124. The position of the dielectric 118 and its polysilicon cap 124 is defined by an opening in an oxide layer 130 between the source and drain regions 110 and 112.

Similarly, the NMOS device 106 comprises a source region 114, a drain region 116, a high k dielectric 120, and a polysilicon cap 126. The position of the dielectric 120 and its polysilicon cap 126 is defined by an opening in oxide layer 130 between the source and drain regions 114 and 116.

The capacitor 108 is an MOS capacitor having a relatively large surface area compared to the gate structures of the NMOS/PMOS devices. The capacitor 108 comprises an electrode 132 formed by tying the drain and source areas to one another (e.g., using interconnect metallization (not shown)), a dielectric layer 122 located atop the electrode 132, and a polysilicon cap 128 located above the dielectric layer 122. In one embodiment, the MOS capacitor 108 is a non-critical decoupling capacitor (i.e., a DC or low-frequency application). Ultimately, as described below, the polysilicon cap 128 will form a top electrode for the MOS capacitor 108.

FIG. 1-2 depicts the result of step 206 in FIG. 2, wherein the method 200 deposits a resist protection oxide (RPO) layer 140 having an aperture 142 formed above the gate area of the PMOS device and removes (e.g., etches) the polysilicon cap from above the high k dielectric 118. The deposition of the RPO layer 140, the formation of the aperture 142, and the removal of the polysilicon cap 124 is a well-known process in the art of semiconductor manufacturing for performing a gate last MOS device formation. The RPO layer 140 protects the polysilicon of the NMOS device 106 and the capacitor 108 from the polysilicon etchant. The RPO layer 140 may mask some capacitors and not others. As such, some capacitors may have a polysilicon cap 128 removed by the polysilicon etchant.

Figures 1, 2, 3:
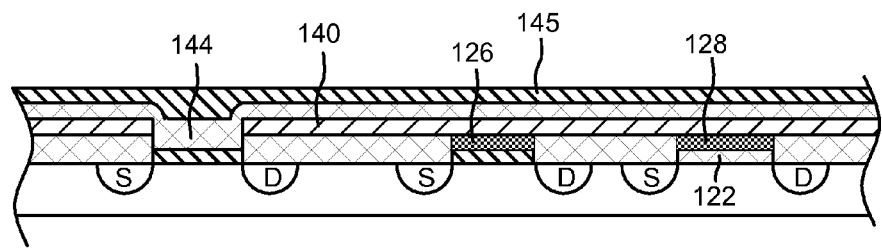
Figures 1, 2, 3, 4:
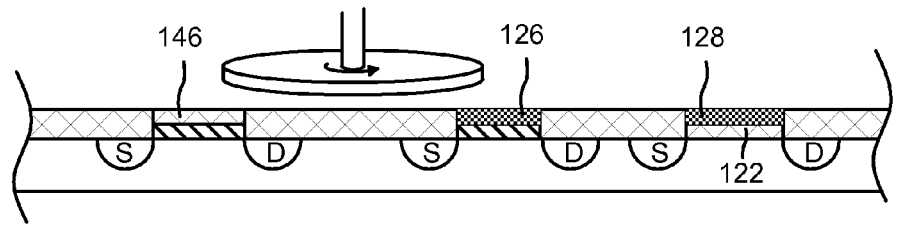
Figures 1, 2, 3, 4, 5:
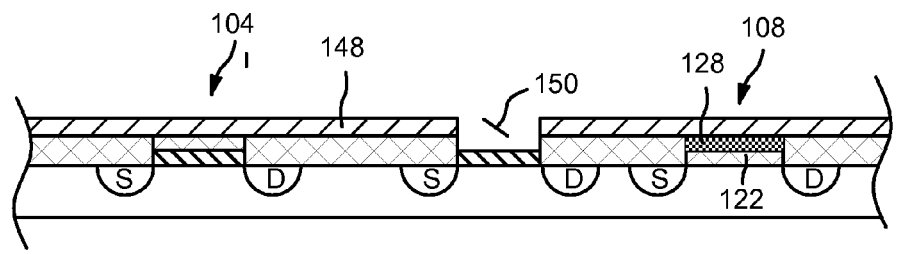
Figures 1, 2, 3, 4, 5, 6:
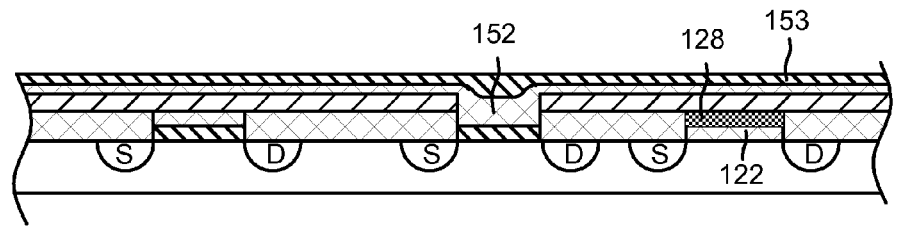
Figures 1, 2, 3, 4, 5, 6, 7:
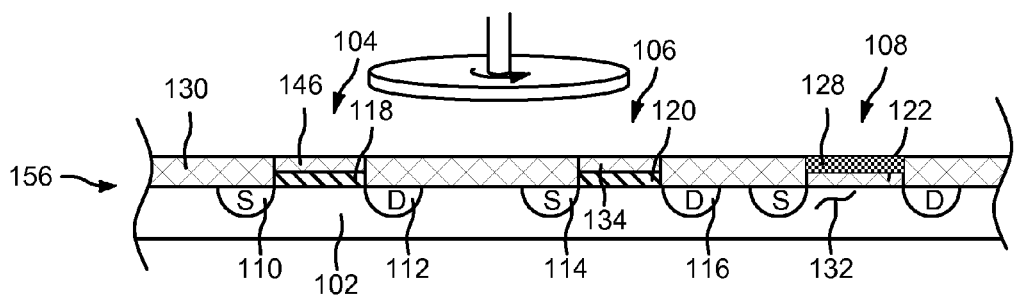
Figure 2:
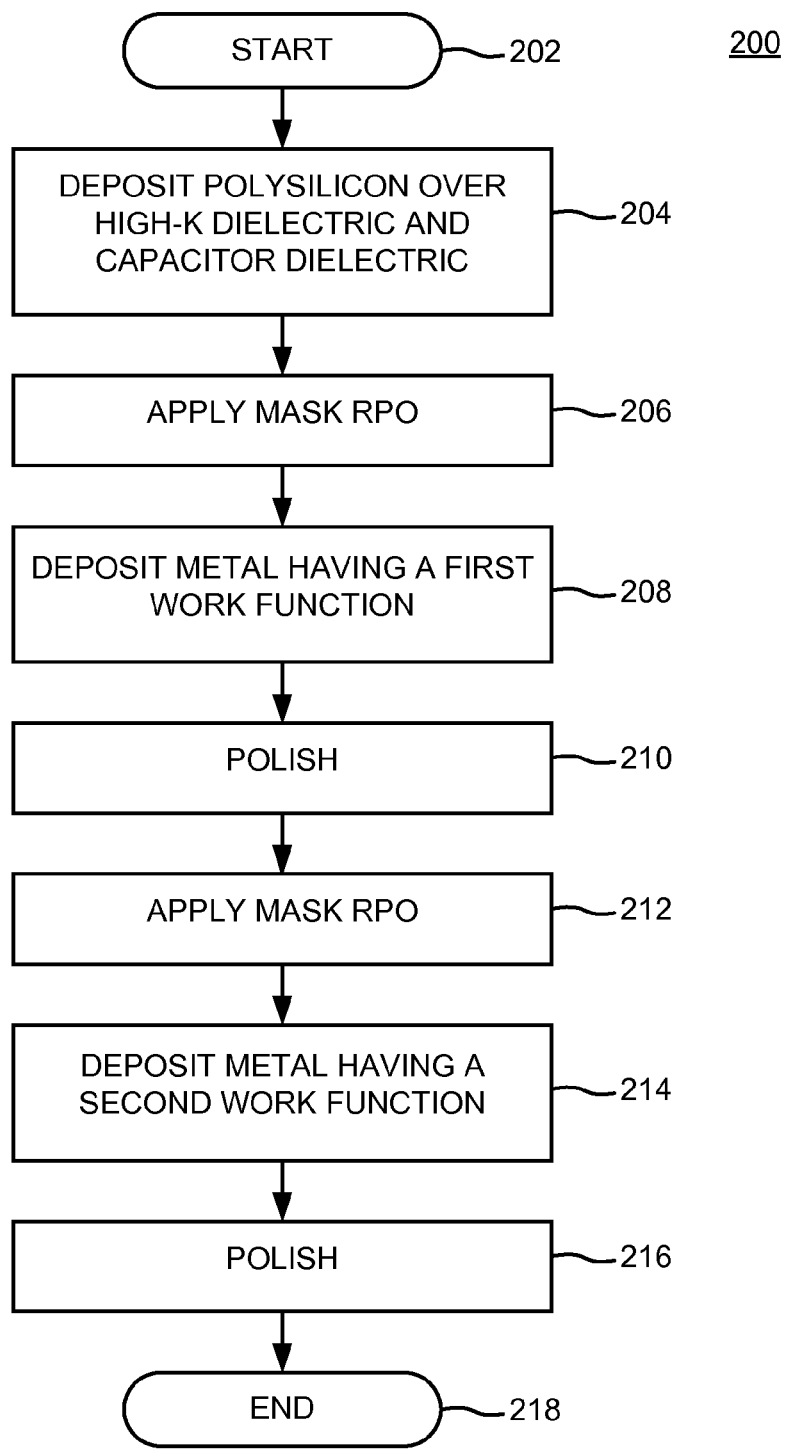
Figure 3:
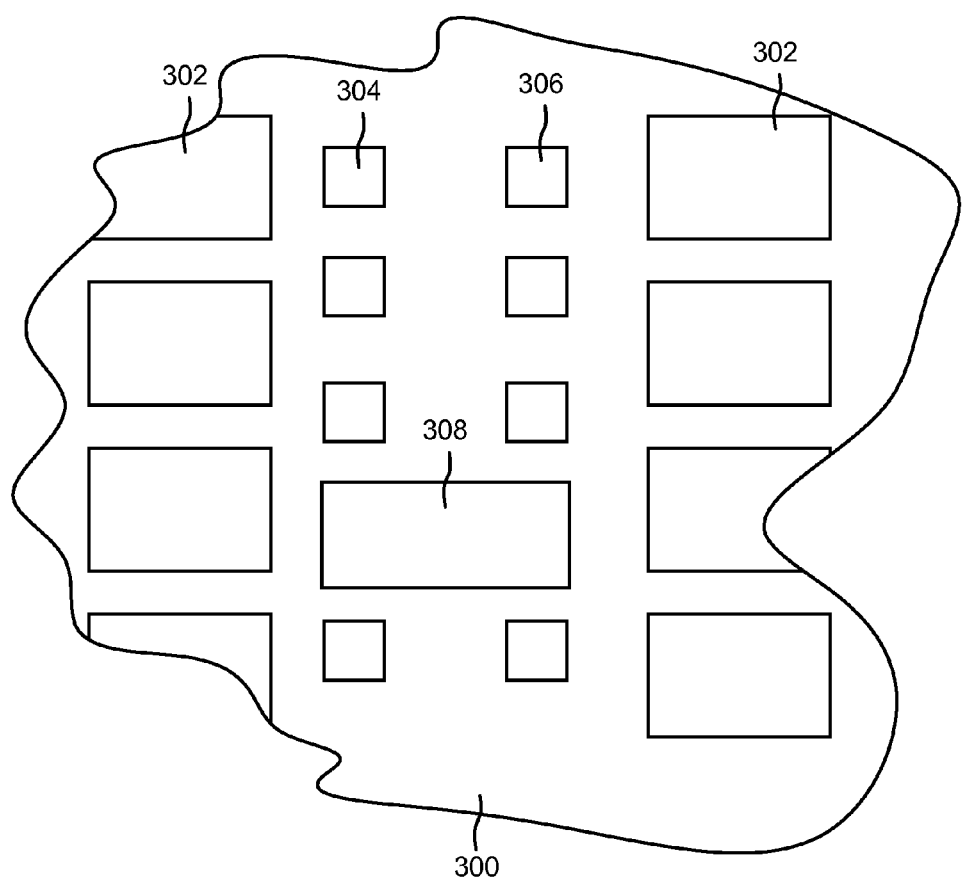

FIG. 1-3 depicts the result of step 208 of the method 200 of FIG. 2. The method 200 sequentially deposits a work function metal (e.g., TiN) layer 144 for a PMOS device and a connection metal (e.g., Al) layer 145, i.e., the gate electrode metal and a fill metal. Such deposition can be performed using conventional deposition techniques, for example, chemical vapor deposition (CVD), physical vapor deposition (PVD), and/or combinations thereof.

FIG. 1-4 depicts the result of step 210 of the method 200 of FIG. 2. The method 200 performs chemical mechanical polishing (CMP) of the metal layers 144 and 145. CMP planarizes the substrate and leaves the gate metal and fill metal as a portion of the high k gate stack. In a gate last process to form NMOS and PMOS devices as part of the same substrate, CMP is performed twice. Step 210 and FIG. 1-4 represent the first CMP step that removes excess metallization 144/145 and removes the RPO layer 140. As such, the polysilicon caps 126 and 128 are exposed.

FIG. 1-5 depicts the result of step 212 of the method 200 of FIG. 2. The method 200 deposits a resist protection oxide (RPO) layer 148 having an aperture 150 formed above the gate area of the NMOS device and removes (e.g., etches) the polysilicon cap 126 from above the high k dielectric 120. The deposition of the RPO layer 148, the formation of the aperture 150, and the removal of the polysilicon cap 126 is a well-known process in the art of semiconductor manufacturing for performing a gate last MOS device formation. The RPO layer 148 protects the metallization of the PMOS device 104 and the polysilicon cap 128 of the capacitor 108 from the polysilicon etchant.

FIG. 1-6 depicts the result of step 214 of the method 200 of FIG. 2. The method 200 sequentially deposits a work function metal (e.g., TiAlN) layer 152 and a connection metal (e.g., Al) layer 153, i.e., the gate electrode metal and a fill metal. Such deposition can be performed using conventional deposition techniques, for example, chemical vapor deposition (CVD), physical vapor deposition (PVD), and/or combinations thereof.

FIG. 1-7 depicts the result of step 216 of the method 200 of FIG. 2. The method 200 performs chemical mechanical polishing (CMP) of the metal layers 152 and 153. CMP planarizes the substrate and leaves the gate metal and fill metal as a portion of the high k gate stack. Step 210 and FIG. 1-7 represent the second CMP step. The method 200 ends at step 218. Subsequent conventional processing steps (not shown) can be used to provide interconnection metallization for the devices to complete an integrated circuit.

The foregoing embodiment used TiN, TiAlN and Al as the work function and interconnection metals. Those skilled in the art will realize that, in alternative embodiments, other work function and interconnection metals may be used. For example, such other metals as gold, silver, nickel, tungsten, copper, and the like, as well as combinations thereof, may be used as at least one of the work function metal or the interconnection metal.

As a result of the large area of polysilicon forming the top electrode of the capacitor compared to the area of the PMOS gate metal, the second CMP step causes much less dishing of the PMOS gate metal than occurs in a conventional gate last process.

FIG. 3 is an illustration of a top plan view of the substrate 100 after the method 200 of FIG. 2 is completed. The substrate 100 comprises at least one first type device area (first area) 304, at least one second type device area (second area) 306 and a capacitor area (third area) 302. The third area 302 is larger than the sum of the first and second areas 304 and 306. As such, the polysilicon in the large area 302 mitigates the dishing of the metal in the first and second areas, and especially in the first type device area 304.

In the embodiment described above, the PMOS device is formed first. In other embodiments, the NMOS device may be formed first. In such embodiments, the area provided with substantial dishing mitigation will be the NMOS area (i.e., the first device that is formed in the gate last approach).

To improve the dishing mitigation further, a plurality of capacitor areas 302 and a plurality of device areas 304/306 can be formed in a checkerboard pattern, such as that shown in FIG. 3. Such a checkerboard pattern distributes the capacitor areas 302 amongst device areas 304/306. Furthermore, a plurality of capacitor areas (e.g., area 308) may be formed between the device areas 304/306. Such distribution increases the protective effect of the polysilicon cap (top electrode) of the capacitor areas to mitigate gate electrode dishing.

In other embodiments, the capacitors are selected to be masked such that the polysilicon cap remains and is used as an electrode located near the center of the substrate.

In other embodiments, protection of the polysilicon cap to facilitate having a select number of MOS capacitors to use polysilicon top electrodes, may be used in a gate first approach. Embodiments of the invention may find use in any situation where a substantial portion of the metallization comprises capacitor top electrodes. In these situations, some of the top electrode metallization can be replaced with polysilicon in the manner described above, to create an area of protective polysilicon for CMP dishing mitigation.

Various elements, devices, and modules are described above in association with their respective functions. These elements, devices, and modules are considered means for performing their respective functions as described herein.

While the foregoing is directed to embodiments of the present invention, other and further embodiments of the invention may be devised without departing from the basic scope thereof, and the scope thereof is determined by the claims that follow.

What is claimed is:

1. An integrated circuit structure, comprising:
   a first area comprising at least one first type device that has a metal layer and a dielectric layer;
   a second area comprising at least one second type device that has a metal layer and a dielectric layer;
   wherein the metal layer of the first area has a first surface that defines a first plane, the metal layer of the second area has a second surface that defines a second plane, the dielectric layer of the first area has a third surface that defines a third plane, and the dielectric layer of the second area has a fourth surface that defines a fourth plane; and
   a third area comprising at least one capacitor having an uppermost layer of polysilicon that has a surface that defines a fifth plane, and the capacitor having a dielectric layer that has a surface that defines a sixth plane,
   wherein the first, second, and fifth planes are coplanar and the third, fourth, and sixth planes are coplanar,
   wherein an area of the layer of polysilicon is greater than a sum of areas of the metal layers in the first and second areas, and
   wherein the third area is distributed among the first and second areas.

2. The integrated circuit structure of claim 1, wherein the second type device is different from the first type device.

3. The integrated circuit structure of claim 2, wherein the first type device is an NMOS device and the second type device is a PMOS device.

4. The integrated circuit structure of claim 2, wherein the first type device is a PMOS device and the second type device is an NMOS device.

5. The integrated circuit structure of claim 1, wherein the at least one first type and at least one second type devices are fabricated using a gate last process.

6. The integrated circuit structure of claim 1, wherein the first area, second area and third area are arranged to have a surface in a checkerboard pattern.

7. The integrated circuit structure of claim 1, wherein the uppermost layer of polysilicon in the third area is located near a center of a substrate comprising the integrated circuit structure.

8. The integrated circuit structure of claim 1, wherein:
   the first surface is opposite another surface of the metal layer of the first area that faces the dielectric layer of the first area; and
   the second surface is opposite another surface of the metal layer of the second area that faces the dielectric layer of the second area.

9. A integrated circuit structure, comprising:
   at least one first type device comprising a first metal electrode and a dielectric layer;
   at least one second type device comprising a second metal electrode and a dielectric layer;
   wherein the first metal electrode has a first surface that defines a first plane, the second metal electrode has a second surface that defines a second plane, the dielectric layer of the at least one first type device has a third surface that defines a third plane, and the dielectric layer of the at least one second type device has a fourth surface that defines a fourth plane; and
   at least one capacitor comprising a polysilicon layer having a surface that defines a fifth plane, wherein the first, second, and fifth planes are coplanar to enable uniform polishing of the first and second metal electrodes, and the capacitor having a dielectric layer that has a surface that defines a sixth plane, wherein the third, fourth, and sixth planes are coplanar,
   wherein the at least one capacitor is distributed among the first and second type devices.

10. The integrated circuit structure of claim 9, wherein the second type device is different from the first type device.

11. The integrated circuit structure of claim 10, wherein the first type device is an NMOS device or a PMOS device, respectively, and the second type device is a PMOS device or an NMOS device, respectively.

12. The integrated circuit structure of claim 9, wherein the at least one first type and at least one second type devices are fabricated using a gate last process.

13. The integrated circuit structure of claim 9, wherein the at least one first type device, the at least one second type device, and the at least one capacitor are arranged in a checkerboard pattern.

14. The integrated circuit structure of claim 9, wherein the polysilicon layer of the at least one capacitor is located near a center of a substrate comprising the integrated circuit structure.

15. The integrated circuit structure of claim 9, wherein:
   the first surface is opposite another surface of the first metal electrode that faces the dielectric layer of the at least one first type device; and the second surface is opposite another surface of the second metal electrode that faces the dielectric layer of the at least one second type device.

* * * * *